United States Patent
Sugita

(10) Patent No.: US 10,340,201 B2
(45) Date of Patent: Jul. 2, 2019

(54) MULTILAYER HEAT-CONDUCTIVE SHEET, AND MANUFACTURING METHOD FOR MULTILAYER HEAT-CONDUCTIVE SHEET

(71) Applicant: DEXERIALS CORPORATION, Tokyo (JP)

(72) Inventor: Junichiro Sugita, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 283 days.

(21) Appl. No.: 15/257,013

(22) Filed: Sep. 6, 2016

(65) Prior Publication Data

US 2016/0372400 A1    Dec. 22, 2016

Related U.S. Application Data

(63) Continuation of application No. PCT/JP2015/054415, filed on Feb. 18, 2015.

(30) Foreign Application Priority Data

Mar. 4, 2014 (JP) ................. 2014-041872

(51) Int. Cl.
    *H01L 23/373*    (2006.01)
    *H01L 23/36*     (2006.01)
    *H01L 21/48*     (2006.01)

(52) U.S. Cl.
    CPC ...... *H01L 23/3737* (2013.01); *H01L 21/4803* (2013.01); *H01L 23/36* (2013.01); *H01L 23/3735* (2013.01); *H01L 2924/0002* (2013.01)

(58) Field of Classification Search
    CPC .................................................. H01L 23/3737
    See application file for complete search history.

(56) References Cited

U.S. PATENT DOCUMENTS

2013/0140014 A1    6/2013  Supriya et al.

FOREIGN PATENT DOCUMENTS

| JP | H09-296114 A | 11/1997 |
|----|--------------|---------|
| JP | 2002-176126 A | 6/2002 |
| JP | 3498823 B2 | 2/2004 |
| JP | 2006-121051 A | 5/2006 |
| JP | 2006-241333 A | 9/2006 |
| JP | 2009-241440 A | 10/2009 |
| JP | 2009241440 A * | 10/2009 |

(Continued)

OTHER PUBLICATIONS

Sep. 15, 2016 International Preliminary Report on Patentability issued in PCT Application No. PCT/JP2015/054415.

*Primary Examiner* — Daniel H Lee
(74) *Attorney, Agent, or Firm* — Oliff PLC

(57) ABSTRACT

Peeling due to interfacial fracture between a tack-free layer 11 and a heat-conductive layer is prevented. In the tack-free layer, an inorganic filler having a median diameter of 0.5 μM or more is contained in a thermoplastic resin having a glass transition temperature of 60° C. or higher to form concaves and convexes on an adhesive surface. Then, the heat-conductive layer being in contact with the adhesive surface is disposed. The adhesion between the tack-free layer and the heat-conductive layer is strengthened by an anchor effect caused by the concaves and convexes of the adhesive surface, without strengthening the adhesion of the surface opposite to the adhesive surface.

5 Claims, 2 Drawing Sheets

(56) References Cited

FOREIGN PATENT DOCUMENTS

| JP | 2010-093077 A | 4/2010 |
|----|---------------|--------|
| JP | 2013-101999 A | 5/2013 |
| JP | 2013-149782 A | 8/2013 |

\* cited by examiner

MULTILAYER HEAT-CONDUCTIVE SHEET, AND MANUFACTURING METHOD FOR MULTILAYER HEAT-CONDUCTIVE SHEET

TECHNICAL FIELD

The present invention generally relates to a heat-conductive sheet which adheres to an electronic component or the like and improves heat dissipation properties of the electronic component.

BACKGROUND ART

A heat-conductive sheet is disposed between an electronic component or the like serving as a heat generating source and a heat sink such as a radiator plate and a casing, for improving heat dissipation properties of the electronic component.

Such a heat-conductive sheet is required to have adhesiveness and flexibility from the viewpoint of workability when assembling an electronic component and a heat sink using the heat-conductive sheet. Since a material having high flexibility is strong in adhesiveness, an electronic component to which the heat-conductive sheet is adhered likely cannot be separated from a heat dissipating component such as a heat sink.

When adhesiveness is strong, workability when removing an electronic component from a heat dissipating component is poor. Furthermore, even if an electronic component can be removed, it is difficult to determine on which of an electronic component or a heat dissipating component the heat-conductive sheet remains.

On the other hand, from the viewpoint of reworkability when correcting misalignment caused during assembling of an electronic component and a heat dissipating component or when reassembling an electronic component and a heat dissipating component which have been once assembled and thereafter disassembled for any reason, it is said that a heat-conductive sheet preferably has high adhesiveness on one side while having low adhesiveness on the other side.

Under such circumstances, when a heat-conductive sheet is formed from a silicone rubber and a heat-conductive filler, there has been proposed performing a non-adhesion treatment by irradiating the surface of the heat-conductive sheet with ultraviolet rays (Japanese Patent No. 3498823).

Furthermore, there has been proposed, in an adhesive heat-conductive sheet including an acrylic-based polyurethane resin containing a non-functional acrylic polymer and a heat-conductive filler, coating a front surface layer and a back surface layer overlapping each other, each having a different formulating ratio of the acrylic-based polyurethane resin to the non-functional acrylic polymer, thereby the adhesiveness is different between the front and back of the adhesive heat-conductive sheet (JPA 2010-93077).

However, performing ultraviolet irradiation for lowering the adhesiveness of one surface of the heat-conductive sheet as disclosed in Japanese Patent No. 3498823 causes deterioration of the layer responsible for heat-conductivity.

Furthermore, as disclosed in JPA 2010-93077, when coating a front surface layer and a back surface layer overlapping each other, each having a different formulating ratio of the acrylic-based polyurethane resin to the non-functional acrylic polymer, the front surface layer and the back surface layer are likely to be mixed together. Therefore, it is difficult to adjust the adhesivenesses of the front surface layer and the back surface layer as required.

There is a method of providing a non-adhesive tack-free layer on one surface of a heat-conductive layer having adhesiveness thereby to obtain a two-layer structure. An example of such a method includes making a tack-free layer including a large amount of a heat-conductive filler so as to reduce the adhesion of the surface, or disposing a substrate material such as paper or a film on one surface so as to reduce the adhesion of the surface.

However, a heat-conductive sheet obtained in such a method has a problem that the flexibility of the heat-conductive sheet deteriorates, and heat-conductivity decreases, thereby reducing the performance of the heat-conductive sheet.

Furthermore, deformability (stretchability) caused by stress such as bending and stretching applied during a peeling operation is different between the coat of the tack-free layer and the heat-conductive layer which is required to have flexibility. Therefore, when adhesiveness between the tack-free layer and the heat-conductive layer is insufficient, interfacial fracture is easily caused.

In particular, the tack-free layer including a resin having a high glass transition temperature for reducing tack (tackiness) is poor in adhesion with the heat-conductive layer, and thus, there is a problem that the tack-free layer and the heat-conductive layer are peeled from each other.

SUMMARY OF INVENTION

An object of embodiments of the present invention is to provide a technology for enhancing the adhesion between the tack-free layer and the heat-conductive layer and preventing interfacial fracture between the tack-free layer and the heat-conductive layer.

In order to solve the above-described problem, an embodiment of the present invention is a multilayer heat-conductive sheet including a heat-conductive layer and a tack-free layer being in contact with each other, in which the heat-conductive layer includes a binder resin, the tack-free layer includes a thermoplastic resin having a glass transition temperature of 60° C. or higher, and an inorganic filler having a median diameter of at least 0.5 μm, the tack-free layer has a thickness of at least 3 μM and at most 15 μm, and when the heat-conductive layer and the tack-free layer come into contact with each other, a Bekk smoothness of the tack-free layer is within a range of at least 20 seconds and at most 300 seconds.

In embodiments, the binder resin contained in the heat-conductive layer includes an acrylic-based resin having a glass transition temperature within a temperature range of −80° C. or higher and 15° C. or lower, and the thermoplastic resin included in the tack-free layer has a glass transition temperature within a range of 60° C. or higher and 110° C. or lower.

In embodiments, the thermoplastic resin is a resin that is incompatible with the binder resin.

In embodiments, the inorganic filler and the thermoplastic resin in the tack-free layer have a weight ratio of 5:95 or more.

In embodiments, a resin that forms the tack-free layer is a polyvinyl butyral resin, a polyester resin, or a urethane resin.

An embodiment of the present invention is a manufacturing method of manufacturing a multilayer heat-conductive sheet of which a tack-free layer and a heat-conductive layer are disposed to be in contact with each other, the method including the steps of: a tack-free layer formation step for forming the tack-free layer having an adhesive surface having a Bekk smoothness within a range of at least 20 seconds and at most 300 seconds by including a thermoplastic resin having a glass transition temperature of 60° C. or higher with an inorganic filler having a median diameter of at least 0.5 μm in a manner such that apart of the inorganic filler is projected from a layer of the thermoplastic resin; and a heat-conductive layer disposition step for bringing the heat-conductive layer containing a binder resin into contact with the adhesive surface of the tack-free layer.

In embodiments, the binder resin includes an acrylic-based resin having a glass transition temperature within a temperature range of −80° C. or higher and 15° C. or lower, and a resin having a glass transition temperature within a range of 60° C. or higher and 110° C. or lower is used for the thermoplastic resin.

In embodiments, a resin that is incompatible with the binder resin is used as the thermoplastic resin.

In embodiments, a resin that forms the tack-free layer is a polyvinyl butyral resin, a polyester resin, or a urethane resin.

In embodiments, the inorganic filler and the thermoplastic resin in the tack-free layer has a weight ratio of 5:95 or more.

As discussed above, in embodiments of the present invention, concaves and convexes are formed in the tack-free layer by containing the inorganic filler having an average particle size (a filler is constituted by a large amount of microparticles or a large amount of minute flakes, and a median diameter was adopted as the average particle size of those particles in the present invention. Median diameter is abbreviated as "D50") of at least 0.5 μm in the tack-free layer having a thickness of at least 1 μm and at most 15 μm. Accordingly, a convex portion by the inorganic filler and a concave portion between the convex portions are formed on the surface of the tack-free layer, so that the adhesion between the tack-free layer and the heat-conductive layer is enhanced by an anchor effect.

Advantageous Effects of Invention

An embodiment of the heat-conductive sheet according to the present invention includes a laminate of the heat-conductive layer and the tack-free layer having adhesion which is lower than the adhesion of the heat-conductive layer. Therefore, workability when assembling an electronic component and another component (such as, a heat dissipating component) with the heat-conductive sheet is enhanced. Furthermore, when peeling an electronic component from another component, interfacial fracture between the heat-conductive layer and the tack-free layer, that is, interlayer peeling, is not caused while the peeling is successfully achieved. Accordingly, reworkability when reassembling a once assembled product is enhanced.

DETAILED DESCRIPTION OF THE INVENTION

Figure 1:
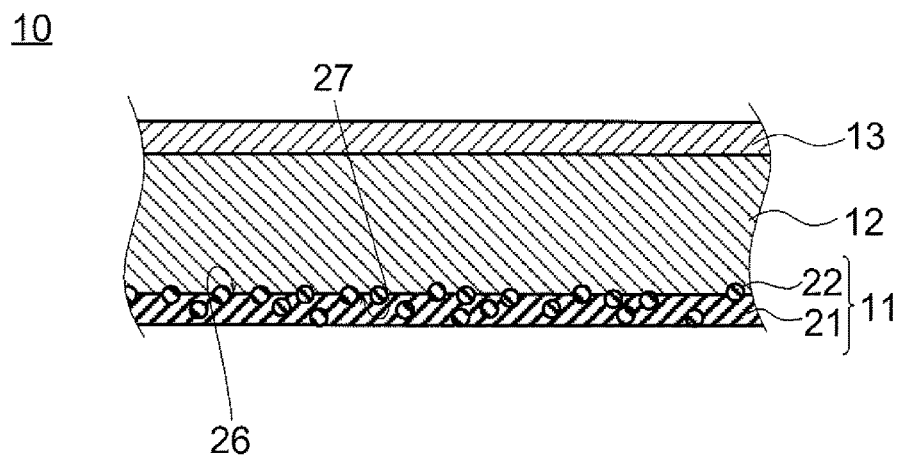
FIG. 1 shows an exemplary multilayer heat-conductive sheet according to the present invention.

Hereinafter, embodiments of the present invention will be described in detail. Reference numeral 10 of FIG. 1 indicates the exemplary multilayer heat-conductive sheet according to the present invention.

This multilayer heat-conductive sheet 10 includes a tack-free layer 11 and a heat-conductive layer 12 having an adhesion stronger than the adhesion of the tack-free layer 11.

One surface of the tack-free layer 11 is in contact with and adheres to one surface of the heat-conductive layer 12. Here, when the surfaces adhered to each other are defined as adhesive surfaces 26 and 27, the surface opposite to the adhesive surface 26 of the tack-free layer 11 is exposed, and a release film 13 is adhered to the surface opposite to the adhesive surface 27 of the heat-conductive layer 12.

Figure 2:
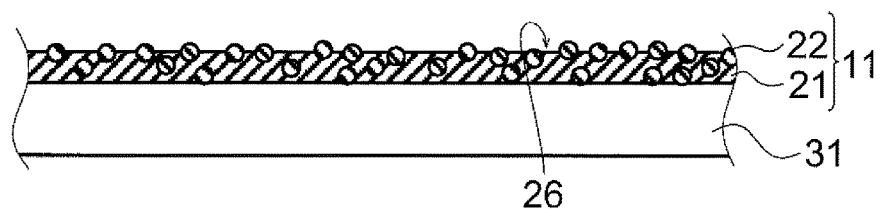
FIGS. 2(a) and 2(b) show an example of the manufacturing method of a multilayer heat-conductive sheet according to the present invention.
Figure 2:
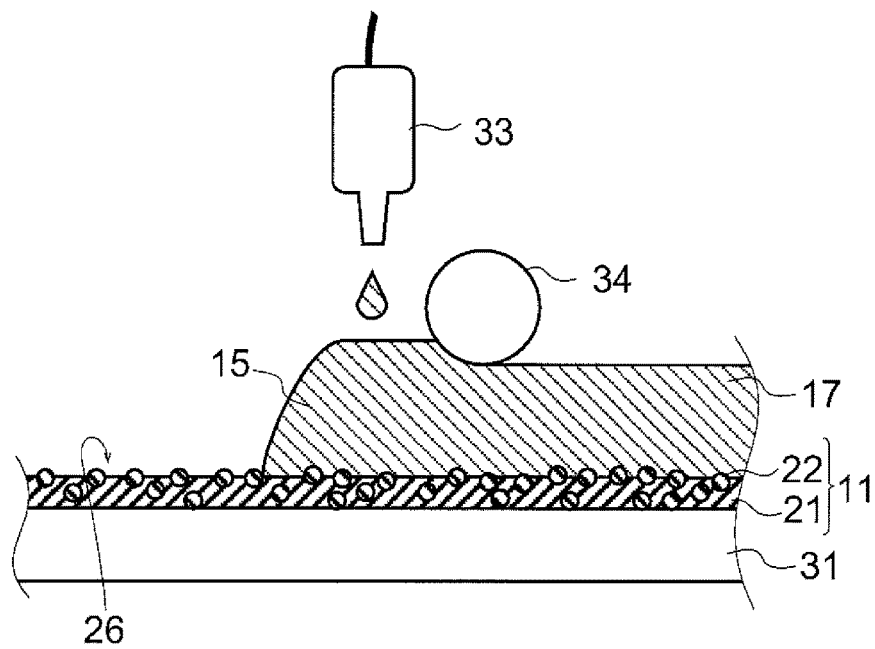

Hereinafter, the manufacturing process of the multilayer heat-conductive sheet 10 will be described. First, a tack-free layer raw material liquid containing a thermoplastic resin having a glass transition temperature of 60° C. or higher and an inorganic filler is prepared. Then, as shown in FIG. 2(a), the liquid is applied onto a board 31 using a bar coater, and the applied liquid is dried. Thus, the tack-free layer 11 having flexibility is obtained.

The tack-free layer 11 is applied and dried in a manner such that the film thickness after drying falls within a range of at least 3 μm and at most 15 μm.

Reference numeral 22 in FIG. 2(a) indicates an inorganic filler which is dispersed in a thermoplastic resin 21. The ratio of the inorganic filler 22 relative to the thermoplastic resin 21 is 5/95 or more in terms of weight ratio.

The inorganic filler 22 having an average particle size (D50) of 0.5 μm or more is used, and the diameter of the inorganic filler 22 is significant with respect to the film thickness of the tack-free layer 11.

Therefore, provided that the surface of the flat portion of the surface formed with the thermoplastic resin 21 of the tack-free layer 11 is a thermoplastic resin surface, part of the inorganic filler 22 is projected from the surface of the thermoplastic resin 21 in a state of being covered with the thermoplastic resin 21. Thus, a convex portion by the inorganic filler 22 and a concave portion between the convex portions are formed on the thermoplastic resin 21. The above-discussed particle diameter and content of the inorganic filler 22 are set in a manner such that when the smoothness of the adhesive surface 26 of the tack-free layer 11 is measured by a Bekk smoothness tester (JIS 8119: 1998), the time for which 1 ml of air discharged in the measurement passes the convex portion and the concave portion formed on the surface of the tack-free layer 11 is within a range of at least 20 seconds and at most 300 seconds.

Here, in the measurement of Bekk smoothness, a larger measured time in terms of seconds means that transfer of air took a longer time. This means that the measured region is smooth. That is, when the measured time is 300 seconds or less, this means that concaves and convexes are formed to a certain degree for enhancing the adhesiveness between the tack-free layer 11 and the heat-conductive layer 12. On the other hand, when the Bekk smoothness is less than 20 seconds, the formulation amount of the inorganic filler 22 tends to be excessive, and thus, the tack-free layer 11 itself comes to be fragile, which does not suit for the object of the present invention.

Next, as shown in FIG. 2(b), a heat-conductive layer raw material liquid containing an acrylic-based compound having photopolymerizability and a heat-conductive filler is applied to the surface of the tack-free layer 11 from a coater 33. The applied heat-conductive layer raw material liquid 15 is smoothened by a bar 34 to obtain a flattened layer 17 having a flat surface.

The concave portion of the tack-free layer 11 as a lower layer is filled with the heat-conductive layer raw material liquid 15 constituting the flattened layer 17, and the convex portion of the tack-free layer 11 is covered with the heat-conductive layer raw material liquid 15 constituting the flattened layer 17.

The heat-conductive layer raw material liquid 15 contains a plasticizer, a curing agent, and a photopolymerization initiator. A transparent release film is stuck to the flattened layer 17 disposed on the tack-free layer 11. After that, both the release film side and the tack-free layer 11 side opposite to the release film side are irradiated with light so as to polymerize the compound having photopolymerizability in the flattened layer 17. Thus, the multilayer heat-conductive sheet 10 shown in FIG. 1 is obtained. This multilayer heat-conductive sheet 10 has flexibility.

Reference numeral 12 in FIG. 1 indicates a heat-conductive layer formed from the flattened layer 17 through photo-curing. The heat-conductive layer 12 is thicker than the tack-free layer 11, and has flexibility. Reference numeral 13 indicates a release film.

In this multilayer heat-conductive sheet 10, the adhesive surface 26 of the tack-free layer 11 has a convex portion and a concave portion, and the adhesive surface 27 of the heat-conductive layer 12 has a concave portion and a convex portion. The concave portions and convex portions of the tack-free layer 11 and the heat-conductive layer 12 are engaged with each other to obtain an anchor effect between the tack-free layer 11 and the heat-conductive layer 12. Therefore, the adhesion between the tack-free layer 11 and the heat-conductive layer 12 is increased, while the adhesion on the surface opposite to the adhesive surface 26 of the tack-free layer 11 is not increased.

Figure 3:
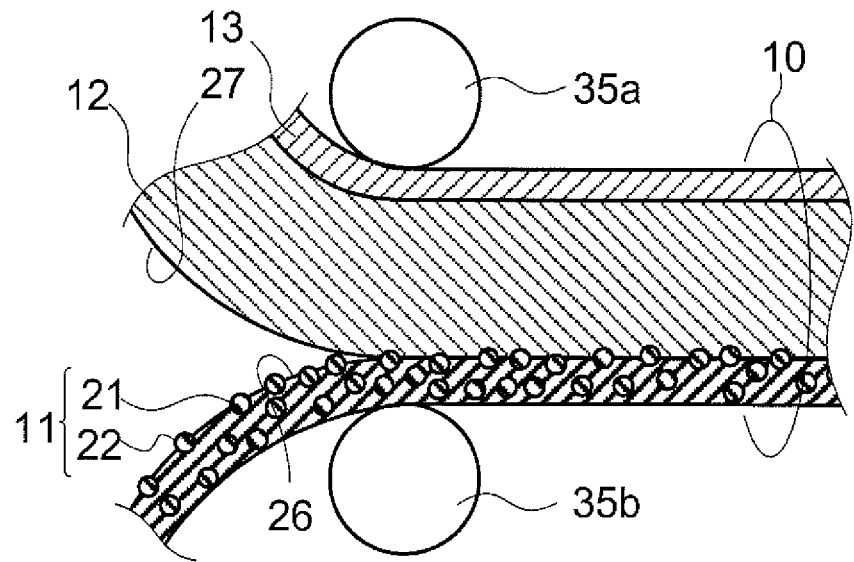
FIG. 3 shows another example of the manufacturing method.

In the above-discussed manufacturing method, the heat-conductive layer raw material liquid 15 is applied onto the tack-free layer 11. However, in a different method, the tack-free layer 11 and the heat-conductive layer 12 may be prepared in advance, and the tack-free layer 11 and the heat-conductive layer 12 having exposed adhesive surfaces 26 and 27 may be sandwiched between rollers 35a and 35b as shown in FIG. 3 to bring the adhesive surfaces 26 and 27 of the tack-free layer 11 and the heat-conductive layer 12 into close contact with each other. In the result, the tack-free layer 11 and the heat-conductive layer 12 may be stuck to each other.

The tack-free layer 11 and the heat-conductive layer 12 may be sandwiched between the rollers 35a and 35b in a state such that the release film 13 is stuck to the surface opposite to the adhesive surface 27 of the heat-conductive layer 12.

The multilayer heat-conductive sheet 10 manufactured in this manner has a shape of an elongated tape, and it can be wound around a reel for storing. The wound multilayer heat-conductive sheet 10 is used for the assembling of an electronic component and a heat sink after stripping the release film 13 stuck to the heat-conductive layer 12 side.

In this multilayer heat-conductive sheet 10, the Bekk smoothness of the surface of the tack-free layer 11 before being brought into contact with the heat-conductive layer 12 is set within a range of at least 20 seconds and at most 300 seconds. The formation of concaves and convexes on the surface lowers the Bekk smoothness of the surface. Accordingly, the adhesion between the heat-conductive layer 12 and the tack-free layer 11 becomes stronger than the adhesion when the concaves and convexes are not formed. Therefore, the heat-conductive layer 12 and the tack-free layer 11 are unlikely to be peeled from each other by interfacial fracture.

The components of the heat-conductive layer 12 and the tack-free layer 11 according to the present invention will be described. From the viewpoint of improving the workability when assembling an electronic component and a heat sink with the multilayer heat-conductive sheet 10 used and the reworkability of re-assembling the once assembled product, an acrylic-based compound of which cured product, or an acrylic-based resin, has a glass transition temperature of preferably −80° C. or higher and 15° C. or lower is used as the acrylic-based compound of the heat-conductive layer 12.

As the acrylic-based compound used in the heat-conductive layer 12, a monofunctional (meth)acrylate monomer can be used. Specific examples of the compound include such as, 2-ethylhexyl, lauryl, n-butyl, isobutyl, isobonyl, 2-hydroxyethyl, and 4-hydroxybutyl, or the like.

Among acrylic-based compounds, 2-ethylhexyl acrylate and lauryl acrylate are preferable. Furthermore, at least one compound copolymerizable with these can be used in combination. Examples of such a copolymerizable compound include (meth)acrylic acid, N-vinyl pyrrolidone, itaconic acid, tetrahydrofurfuryl acrylate, ethyl (meth)acrylate, 2-hydroxyethyl (meth)acrylate, 2-hydroxypropyl (meth)acrylate, isobonyl (meth)acrylate, ethoxyethyl (meth)acrylate, butoxyethyl (meth)acrylate, phenoxyethyl (meth)acrylate, phenyl (meth)acrylate, and cyclohexyl (meth)acrylate.

Furthermore, a curing method of the acrylic-based compound in the heat-conductive layer 12 will be described. When a photopolymerization initiator or a photocrosslinker are used, and ultraviolet irradiation is performed as described above, long-wave ultraviolet light (wavelength: at least 320 nm and at most 400 nm) is used for irradiation in an amount of energy necessary for the cleavage of the photopolymerization initiator used. This prevents the heat-conductive layer 12 from deteriorating due to ultraviolet irradiation.

Examples of the heat-conductive filler contained in the heat-conductive layer 12 include metal hydroxides such as aluminum hydroxide and magnesium hydroxide, metals such as aluminum, copper and silver, metal oxides such as alumina and magnesia, nitrides such as aluminum nitride, boron nitride, and silicon nitride, and carbon nanotubes, or the like. One of these heat-conductive fillers may be contained, or two or more of the heat-conductive fillers may be contained in combination.

The average particle size of the heat-conductive filler contained in the heat-conductive layer 12 is preferably at least 0.5 μm and at most 100 μm. In particular, from the viewpoint of dispersibility and heat-conductivity, it is preferable to contain heat-conductive fillers having different particle sizes. For example, it is preferable to contain a small-diameter filler having an average particle size of 3 μm or more and 20 μm or less and a large-diameter filler having an average particle size of 25 μm or more and 100 μm or less in combination.

The content of the heat-conductive filler in the heat-conductive layer 12 with respect to 100 parts by mass of a monomer unit based on the above-described acrylic-based compound is preferably at least 100 parts by mass and at most 2000 parts by mass, and more preferably at least 300 parts by mass and at most 1000 parts by mass. When the content of the heat-conductive filler is excessively low, the heat-conductivity of the multilayer heat-conductive sheet 10 cannot be sufficiently enhanced. On the other hand, an excessively high content of the heat-conductive filler causes the flexibility of the multilayer heat-conductive sheet 10 to decrease, and is therefore not preferable.

When two types of heat-conductive fillers having different average particle sizes are used in the heat-conductive layer 12, the formulating ratio between the small-diameter filler and the large-diameter filler is preferably 15:85 or more and 90:10 or less.

Furthermore, the heat-conductive layer 12 may contain one or more acid ester-based plasticizers selected from adipic acid-based, sebacic acid-based, phosphoric acid-based, castor oil-based, oleic acid-based and acrylic acid-based plasticizers, in an amount of 20 parts by mass or more and 60 parts by mass or less with respect to 100 parts by mass of the monomer unit of the acrylic-based compound.

Specifically, it is preferable to contain one or more plasticizers selected from adipic acid-based compounds such as dioctyl adipate and diisononyl adipate, sebacic acid-based compounds such as octyl sebacate and diisodecyl sebacate, phosphoric acid-based compounds such as tricresyl phosphate, castor oil and a derivative thereof, higher fatty acids such as stearic acid and oleic acid and a derivative thereof, phthalic acid-based compounds such as dibutyl phthalate and dioctyl phthalate, low molecular weight acrylic polymers, wax, and tackifier.

The content of the plasticizer in the heat-conductive layer 12 with respect to 100 parts by mass of the monomer unit based on the above-described acrylic-based compound is preferably at least 20 parts by mass and at most 80 parts by mass, and more preferably at least 30 parts by mass and at most 70 parts by mass.

In addition, the heat-conductive layer 12 can contain an antioxidant, a thermal degradation preventing agent, a flame retardant, a coloring agent, and the like, as necessary.

The film thickness of the heat-conductive layer 12 is preferably within a range of at least 200 μm and at most 2500 μm. When it is excessively thin, sufficient properties to concaves and convexes of an adherend cannot be obtained. When it is excessively thick, time is required for curing, causing deterioration of productivity.

Regarding the tack-free layer 11, the low adhesive strength between the tack-free layer 11 and the heat-conductive layer 12 may lead to failures such as interlayer peeling during handling in work or rework. In order to provide suitable handling, an adhesion of 0.61 N/2 cm or more in terms of T type peeling is required. On the other hand, an adhesion of 6 N/2 cm or less is preferable from the viewpoint of workability when peeling. Thus, when an electronic component and a heat sink are assembled with the multilayer heat-conductive sheet 10, stickiness is not caused, but low adhesiveness is appropriately exerted. Consequently, workability is improved, while reworkability when reassembling a once assembled product is also improved.

In order to prevent the adhesion of the surface opposite to the adhesive surface 26 of the tack-free layer 11 from exceeding a necessary value, the lower limit of the glass transition temperature of the resin that forms the tack-free layer 11 is 60° C., and more preferably 70° C.

When the glass transition temperature is 60° C. or higher, the probe tack of the surface opposite to the adhesive surface 26 of the tack-free layer 11 can be 30 kN/m$^2$ or less, and particularly 25 kN/m$^2$ or less.

On the other hand, the upper limit of the glass transition temperature of the resin that forms the tack-free layer 11 is 110° C. or lower in order to allow the tack-free layer 11 to exert appropriately low adhesiveness and to obtain adhesive strength with the heat-conductive layer 12.

Furthermore, the thermoplastic resin that forms the tack-free layer 11 is preferably incompatible with the acrylic-based compound that forms the heat-conductive layer 12. Thereby, even when applying coating compositions that form respective layers onto each other to form a laminate of the heat-conductive layer 12 and the tack-free layer 11, the formed layers are unlikely to be combined at the interface therebetween. Thus, desired tack properties can be obtained.

Preferred resin for forming the tack-free layer 11 is a thermoplastic resin having a glass transition temperature within a range of 60° C. or higher and 110° C. or lower. Examples of the resin incompatible with the acrylic-based compound that forms the heat-conductive layer 12 may include a polyvinyl butyral resin, a polyester resin, and a urethane resin, or the like. The molecular weight of these is preferably 10000 or more and 500000 or less in terms of number average molecular weight.

The tack-free layer 11 can contain, as necessary, an organic flame retardant (such as, melamine cyanurate), as well as various additives such as a coloring agent and a curing agent.

The tack-free layer 11 is thinner than the heat-conductive layer 12. When the film thickness of the tack-free layer 11 is excessively thin, strength decreases, causing fracture. Accordingly, an object to be adhered comes in contact with the heat-conductive layer 12. When it is excessively thick, heat-conductivity as the multilayer heat-conductive sheet 10 becomes insufficient. Therefore, the film thickness of the tack-free layer 11 is preferably within a range of 1 μm or more and 15 μm or less, and more preferably within a range of 3 μm or more and 15 μm or less.

It is noted that regarding the heat-conductivity of the multilayer heat-conductive sheet 10, the heat-conductivity in the thickness direction of the multilayer heat-conductive sheet 10 is practically required to be 1 W/m·K or more in the measurement by a thermal gradient method in accordance with ASTM D5470. According to the present invention, the heat-conductivity can be 1.5 W/m·K or more, and more preferably 2 W/m·K or more.

Examples of the release film 13 may include a film of PET (polyethylene terephthalate), PEN (polyethylene naphthalate), polyolefin, glassine paper, and the like, coated with a release agent.

Examples

A thermoplastic resin and an inorganic filler are dispersed and dissolved in a mixed solvent of toluene: MEK (methyl ethyl ketone)=1:1. Accordingly, a tack-free layer raw material liquid having a solid content of 10% is obtained.

The types and designations of the thermoplastic resin and the inorganic filler, the average particle diameter of the inorganic filler (a column of "filler D50"), and the weight ratio between the inorganic filler and the thermoplastic resin are shown in Examples 1 to 6 and Comparative Examples 1 to 4 of Table 1 below.

Next, the tack-free layer raw material liquid is applied using a bar coater, and retained in a dryer at 90° C. for five minutes for drying. Accordingly, the tack-free layer 11 shown in FIG. 2(a) is obtained.

The thickness of the tack-free layer 11 is shown in Table 1 below.

TABLE 1

Contents of Tack-Free Layer

| | Thermoplastic resin | Name of resin | Filler | Name of filler | Filler D50 (μm) | Filler/Resin | Thickness (μm) |
|---|---|---|---|---|---|---|---|
| Example 1 | Polyvinyl butyral | S-LEC BX-1 (Sekisui Chemical) | Melamine Cyanurate | STAB\|ACE MC-5S (Sakai Chemical) | 0.5 | 5/95 | 11 |
| Example 2 | Polyvinyl butyral | S-LEC BX-1 (Sekisui Chemical) | Melamine Cyanurate | STAB\|ACE MC-5S (Sakai Chemical) | 0.5 | 20/80 | 9 |
| Example 3 | Polyvinyl butyral | S-LEC BX-1 (Sekisui Chemical) | Melamine Cyanurate | STAB\|ACE MC-5S (Sakai Chemical) | 0.5 | 30/70 | 7 |
| Example 4 | Polyvinyl butyral | S-LEC BX-1 (Sekisui Chemical) | Aluminum hydroxide | B703 (Nippon Light Metal) | 3.5 | 10/90 | 7 |
| Example 5 | Polyvinyl butyral | S-LEC BX-1 (Sekisui Chemical) | Aluminum hydroxide | B703 (Nippon Light Metal) | 5.5 | 10/90 | 8 |
| Example 6 | Polyvinyl butyral | S-LEC BX-1 (Sekisui Chemical) | Aluminum nitride | JC (Toyo aluminum) | 1.2 | 10/90 | 6 |
| Comparative example 1 | Polyvinyl butyral | S-LEC BX-1 (Sekisui Chemical) | — | — | — | — | 7 |
| Comparative example 2 | Polyvinyl butyral | S-LEC BX-1 (Sekisui Chemical) | Melamine Cyanurate | STAB\|ACE MC-5S (Sakai Chemical) | 0.5 | 2/98 | 11 |
| Comparative example 3 | Polyvinyl butyral | S-LEC BX-1 (Sekisui Chemical) | Aluminum oxide (alumina) | ASFP-20 | 0.3 | 10/90 | 8 |
| Comparative example 4 | PET | Lumirror #25 S10 (Toray) | — | — | — | — | 12 |

A heat-conductive layer raw material liquid having components shown in Table 2 below is prepared, and applied onto the above-discussed surface of the tack-free layer 11 such that the thickness becomes 1500 μm. Then, a release film formed by transparent release PET is stuck, and thereafter both the release film 13 side and the tack-free layer 11 side opposite to the release film 13 side are irradiated with light of a chemical lamp for five minutes. Thus, the multilayer heat-conductive sheet 10 including a laminate of the tack-free layer 11 and the heat-conductive layer 12 is obtained.

TABLE 2

Contents of Heat-conductive Layer

| Formulation of heat-conductive layer | Component | Parts by weight |
|---|---|---|
| Thermal monofunctional acrylate | 2-Ethylhexyl acrylate | 100 |
| Plasticizer | Castor oil-derived fatty acid ester | 47 |
| Curing agent | Hydroxypivalic acid neopentyl glycol diacrylate | 1.5 |
| Photopolymerization initiator | Irgacure 819 | 1.4 |
| Heat-conductive filler | Aluminum hydroxide particle diameter: 80 μm | 400 |
| | Aluminum hydroxide particle diameter: 8 μm | 400 |

Each of the obtained multilayer heat-conductive sheets 10 of Examples 1 to 6 and Comparative Examples 1 to 4 is measured for the adhesion between the tack-free layer 11 and the heat-conductive layer 12 using a T type peeling tester.

Furthermore, the release film 13 is peeled from a 9.5 mm×13 mm piece of each of the multilayer heat-conductive sheets 10 of Examples 1 to 6 and Comparative Examples 1 to 4, and the surface on the heat-conductive layer 12 side is applied onto a clean aluminum board. Then, the piece is subjected to pressure bonding with a pressure of 1 kgf/cm² for 10 minutes, and thereafter peeled from the aluminum board. That is, peeling is performed while bending the multilayer heat-conductive sheet 10. At this time, it is visually observed whether lifting initiated between the tack-free layer 11 and the heat-conductive layer 12, that is, peeling due to interfacial fracture, exists.

The Bekk smoothness of the adhesive surface 26 of the tack-free layer 11 where the heat-conductive layer 12 is brought into contact is measured, and these measurement results are indicated in Table 3 below. The measurement air content of the Bekk smoothness is 1 ml.

TABLE 3

Measurement Results

| | Bekk smoothness (sec) | Adhesion (N/2 cm) | Interlayer peeling |
|---|---|---|---|
| Example 1 | 111.0 | 0.61 | o |
| Example 2 | 58.0 | 0.65 | o |
| Example 3 | 33.0 | 0.79 | o |
| Example 4 | 80.0 | 0.61 | o |
| Example 5 | 36.0 | 0.64 | o |
| Example 6 | 270.0 | 0.63 | o |
| Comparative example 1 | >2000 | 0.54 | x |
| Comparative example 2 | 341.0 | 0.53 | x |
| Comparative example 3 | 1463.0 | 0.54 | x |
| Comparative example 4 | >2000 | 0.50 | x |

In Table 3, "o (circle)" indicates that interlayer peeling was not observed between the tack-free layer and the heat-conductive layer, and "x (cross)" indicates that interlayer peeling was observed.

As seen from Table 3, the Bekk smoothness needs to be 300 seconds or less, and particularly 270 seconds or less.

When the Bekk smoothness is excessively low, the strength of the tack-free layer 11 decreases. Therefore, 20 seconds or more is desirable.

In Examples 1 to 6, the adhesion between the tack-free layer 11 and the heat-conductive layer 12 is stronger than in Comparative Examples 1 to 4, and peeling due to interfacial fracture is not caused.

It is noted that a T type peeling tester is "RTG-1225" manufactured by Orientec Co., Ltd., with a pulling rate of 500 mm/min and a sample width of 2 cm.

REFERENCE SIGNS LIST

10 . . . multilayer heat-conductive sheet
11 . . . tack-free layer
12 . . . heat-conductive layer
13 . . . release film
21 . . . thermoplastic resin
22 . . . inorganic filler

What is claimed is:

1. A method of manufacturing a multilayer heat-conductive sheet of which a tack-free layer and a heat-conductive layer are in contact with each other, the method comprising the steps of:
   a tack-free layer formation step for forming the tack-free layer having an adhesive surface having a Bekk smoothness within a range of at least 20 seconds and at most 300 seconds by including a thermoplastic resin having a glass transition temperature of 60° C. or higher with an inorganic filler having a median diameter of at least 0.5 μm in a manner such that a part of the inorganic filler is projected from a layer of the thermoplastic resin; and
   a heat-conductive layer disposition step for bringing the heat-conductive layer including a binder resin in contact with the adhesive surface of the tack-free layer.

2. The method of manufacturing a multilayer heat-conductive sheet according to claim 1,
   wherein the binder resin includes an acrylic-based resin having a glass transition temperature within a temperature range of −80° C. or higher and 15° C. or lower, and
   wherein a resin having a glass transition temperature within a range of 60° C. or higher and 110° C. or lower is used for the thermoplastic resin.

3. The method of manufacturing a multilayer heat-conductive sheet according to claim 2, wherein a resin that forms the tack-free layer is a polyvinyl butyral resin, a polyester resin, or a urethane resin.

4. The method of manufacturing a multilayer heat-conductive sheet according to claim 1, wherein a resin that is incompatible with the binder resin is used as the thermoplastic resin.

5. The method of manufacturing a multilayer heat-conductive sheet according to claim 1, wherein a value of a ratio of the inorganic filler relative to the thermoplastic resin in the tack-free layer is 5:95 or more in terms of weight ratio.

* * * * *